US012616066B2

(12) United States Patent
Wu et al.

(10) Patent No.: US 12,616,066 B2
(45) Date of Patent: Apr. 28, 2026

(54) FOLDABLE MICROLED DISPLAY

(71) Applicant: Prilit Optronics, Inc., Tainan City (TW)

(72) Inventors: Biing-Seng Wu, Tainan City (TW); Hsing-Ying Lee, Tainan City (TW); Meng-Tse Wu, Tainan City (TW)

(73) Assignee: Prilit Optronics, Inc., Tainan City (TW)

( * ) Notice: Subject to any disclaimer, the term of this patent is extended or adjusted under 35 U.S.C. 154(b) by 464 days.

(21) Appl. No.: 18/095,797

(22) Filed: Jan. 11, 2023

(65) Prior Publication Data

US 2024/0234382 A1    Jul. 11, 2024

(51) Int. Cl.

| | |
|---|---|
| *H01L 29/205* | (2006.01) |
| *G09G 3/00* | (2006.01) |
| *G09G 3/20* | (2006.01) |
| *G09G 3/32* | (2016.01) |
| *H01L 33/00* | (2010.01) |
| *H10W 70/60* | (2026.01) |
| *H10W 70/67* | (2026.01) |
| *H10W 90/00* | (2026.01) |

(52) U.S. Cl.
CPC ............ *H10W 90/00* (2026.01); *G09G 3/035* (2020.08); *G09G 3/2096* (2013.01); *G09G 3/32* (2013.01); *H10W 70/611* (2026.01); *H10W 70/688* (2026.01)

(58) Field of Classification Search
CPC . H01L 25/0753; H01L 23/5387; G09G 3/035; H10H 20/00–882; H10H 29/00–142; H10H 29/30–962; H10K 77/10–111; H10K 2102/311
See application file for complete search history.

(56) References Cited

U.S. PATENT DOCUMENTS

| | | | | |
|---|---|---|---|---|
| 2007/0181816 A1* | 8/2007 | Ikeda | ..................... | H10F 39/195 |
| | | | | 250/338.4 |
| 2014/0152646 A1* | 6/2014 | Kang | ..................... | H10K 59/80 |
| | | | | 29/829 |
| 2014/0285992 A1* | 9/2014 | Yang | ..................... | G06F 1/1641 |
| | | | | 29/592.1 |
| 2015/0043187 A1* | 2/2015 | Lee | ......................... | H05K 1/148 |
| | | | | 361/784 |
| 2018/0226386 A1* | 8/2018 | Cok | ...................... | H10D 86/441 |
| 2019/0363266 A1* | 11/2019 | Tanaka | .................. | G06F 1/1681 |
| 2020/0133335 A1* | 4/2020 | Wu | ...................... | H04M 1/0268 |
| 2020/0315015 A1* | 10/2020 | Kim | ......................... | G09G 3/20 |
| 2021/0066641 A1* | 3/2021 | Ai | ......................... | H10K 59/871 |
| 2021/0104506 A1* | 4/2021 | Wu | .......................... | H01L 24/83 |
| 2021/0182010 A1* | 6/2021 | Ji | ........................... | G06F 3/1423 |
| 2022/0093578 A1* | 3/2022 | Lin | ........................ | H01L 25/162 |
| 2023/0017865 A1* | 1/2023 | Park | .................... | H01L 25/0753 |
| 2023/0139217 A1* | 5/2023 | Lee | ...................... | A61B 5/0205 |
| | | | | 600/301 |
| 2023/0222960 A1* | 7/2023 | Jain | ......................... | G09G 3/30 |
| | | | | 324/760.01 |

* cited by examiner

*Primary Examiner* — Ismail A Muse

(74) *Attorney, Agent, or Firm* — Donald E. Stout; Stout, Uxa & Buyan, LLP

(57) ABSTRACT

A foldable micro-light-emitting diode (microLED) display includes a flexible supporting film, a plurality of drivers and a plurality of display panels attached to the supporting film. Each display panel includes a plurality of blocks each having a plurality of microLEDs controlled by a corresponding driver.

15 Claims, 8 Drawing Sheets

300

TCON                    TCON ⁓123

122
121

11

12

12

12

300

12

12

11

300

12

11

12

300

12

11

12

12

400
TCON
TCON — 123
122
121
*FIG. 4E*
12
11B
12
11A
12
11C
12
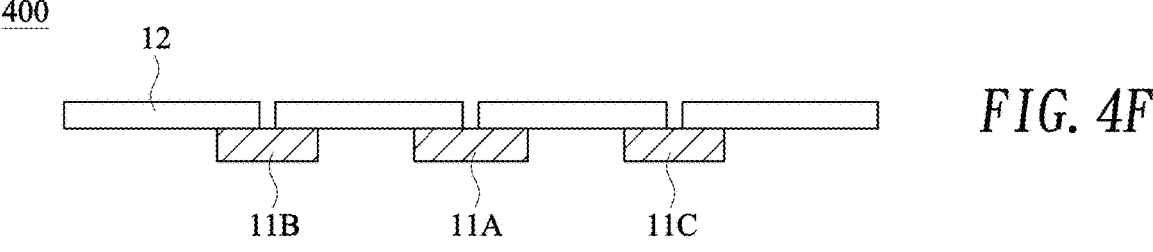
400
12
11B      11A      11C
*FIG. 4F*
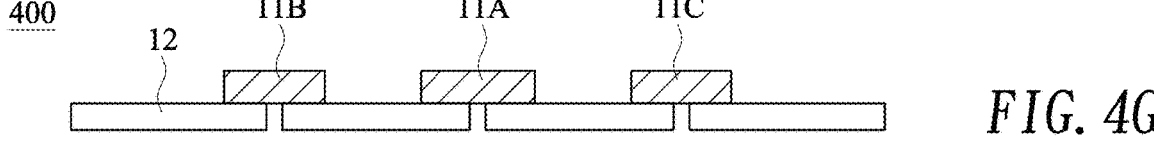
400      11B      11A      11C
12
*FIG. 4G*

600

FOLDABLE MICROLED DISPLAY

BACKGROUND OF THE INVENTION

1. Field of the Invention

The present invention generally relates to a microLED display, and more particularly to a foldable microLED display.

2. Description of Related Art

A micro-light-emitting diode (microLED, mLED or LED) display panel is one of flat display panels, and is composed of microscopic microLEDs each having a size of 1-100 micrometers. Compared to conventional liquid crystal display panels, the microLED display panels offer better contrast, response time and energy efficiency. Although both organic light-emitting diodes (OLEDs) and microLEDs possess good energy efficiency, the microLEDs, based on group III/V (e.g., GaN) LED technology, offer higher brightness, higher luminous efficacy and longer lifespan than the OLEDs.

As size of the microLED display is increasing, a large format display, for example, with a size of 2880 mm×1700 mm, suffers inconvenience of carrying or moving it. In order to improve this situation, multiple display panels individually manufactured are transferred, and are then tiled together on the site to result in a large format display. This scheme, however, takes much time and thus requires high cost to reconstruct the large format display.

In an alternative conventional scheme, a large format display is manufactured entirely on a flexible substrate, thereby resulting in a flexible or rollable display. While rolling the flexible display, a specific rolling direction should be complied, otherwise electronic components such as driver integrated circuits would be bent and damaged. Moreover, even the flexible display is safely rolled in the direction of length to reduce its overall volume, the width of the flexible display cannot be reduced, thereby still causing inconvenience of carrying or moving it.

A need has thus arisen to propose a novel scheme to overcome drawbacks of the conventional large format displays.

SUMMARY OF THE INVENTION

In view of the foregoing, it is an object of the embodiment of the present invention to provide a foldable microLED display with a small folding form factor capable of quickly folding and unfolding at low cost.

According to one embodiment, a foldable micro-light-emitting diode (microLED) display includes a flexible supporting film, a plurality of drivers and a plurality of display panels. The display panels are attached to the supporting film, each display panel including a plurality of blocks each having a plurality of microLEDs controlled by a corresponding driver.

According to another embodiment, a foldable micro-light-emitting diode (microLED) display includes a single flexible substrate and a plurality of drivers. The flexible substrate includes a plurality of blocks each having a plurality of microLEDs controlled by a corresponding driver.

BRIEF DESCRIPTION OF THE DRAWINGS

FIG. 4E shows a top view illustrating a foldable microLED display according to an alternative embodiment of the present invention;

FIG. 4F-FIG. 4G show side views illustrating the foldable microLED display of FIG. 4E;

DETAILED DESCRIPTION OF THE INVENTION

Figures 1A, 1B, 1C, 1D:
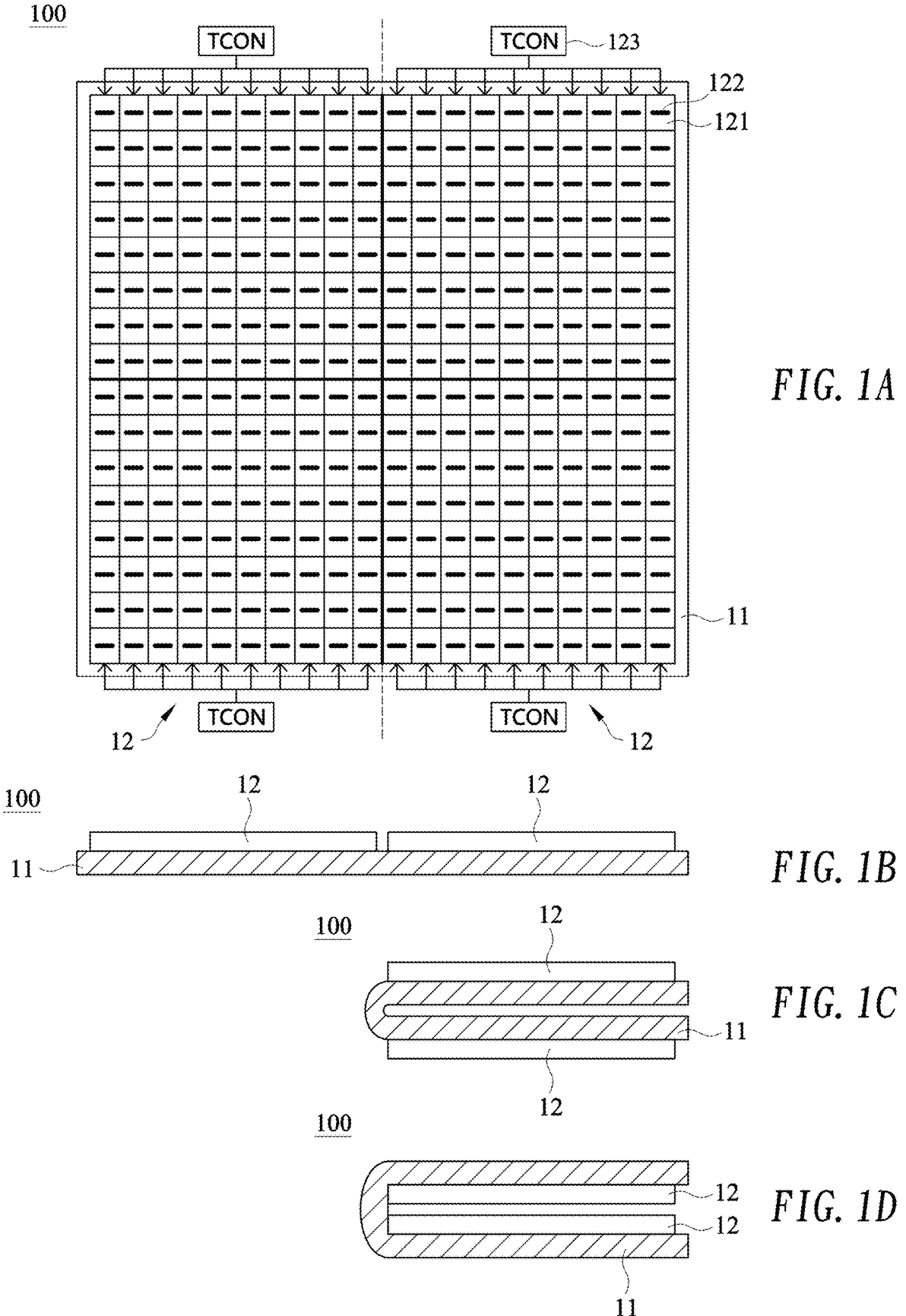
FIG. 1A shows a top view illustrating a foldable micro-light-emitting diode (microLED) display according to one embodiment of the present invention.
FIG. 1B shows a side view illustrating the foldable microLED display of FIG. 1A.
FIG. 1C shows a side view illustrating the foldable microLED display of FIG. 1A being folded.
FIG. 1D shows a side view illustrating the foldable microLED display of FIG. 1A being folded.

FIG. 1A shows a top view illustrating a foldable micro-light-emitting diode (microLED) display 100 according to one embodiment of the present invention, and FIG. 1B shows a side view illustrating the foldable microLED display 100 of FIG. 1A.

In the embodiment, the foldable microLED display 100 may include a flexible supporting film 11, which may include a flexible material such as, but not limited to, polyimide (PI), Polyethylene terephthalate (PET) or polycarbonate (PC). The supporting film 11 may be transparent, semi-transparent or non-transparent. The microLED display 100 may include a plurality of display panels 12 (with a bottom surface) attached to the supporting film 11, for example, by glue. In one exemplary embodiment, each display panel 12 may include a rigid substrate such as glass substrate. Specifically, each display panel 12 may include a plurality of blocks 121 each having a plurality of microLEDs (not shown) controlled by a corresponding driver 122. Each display panel 12 may include at least one timing controller (TCON) 123 configured to control the drivers 122.

Figure 2:
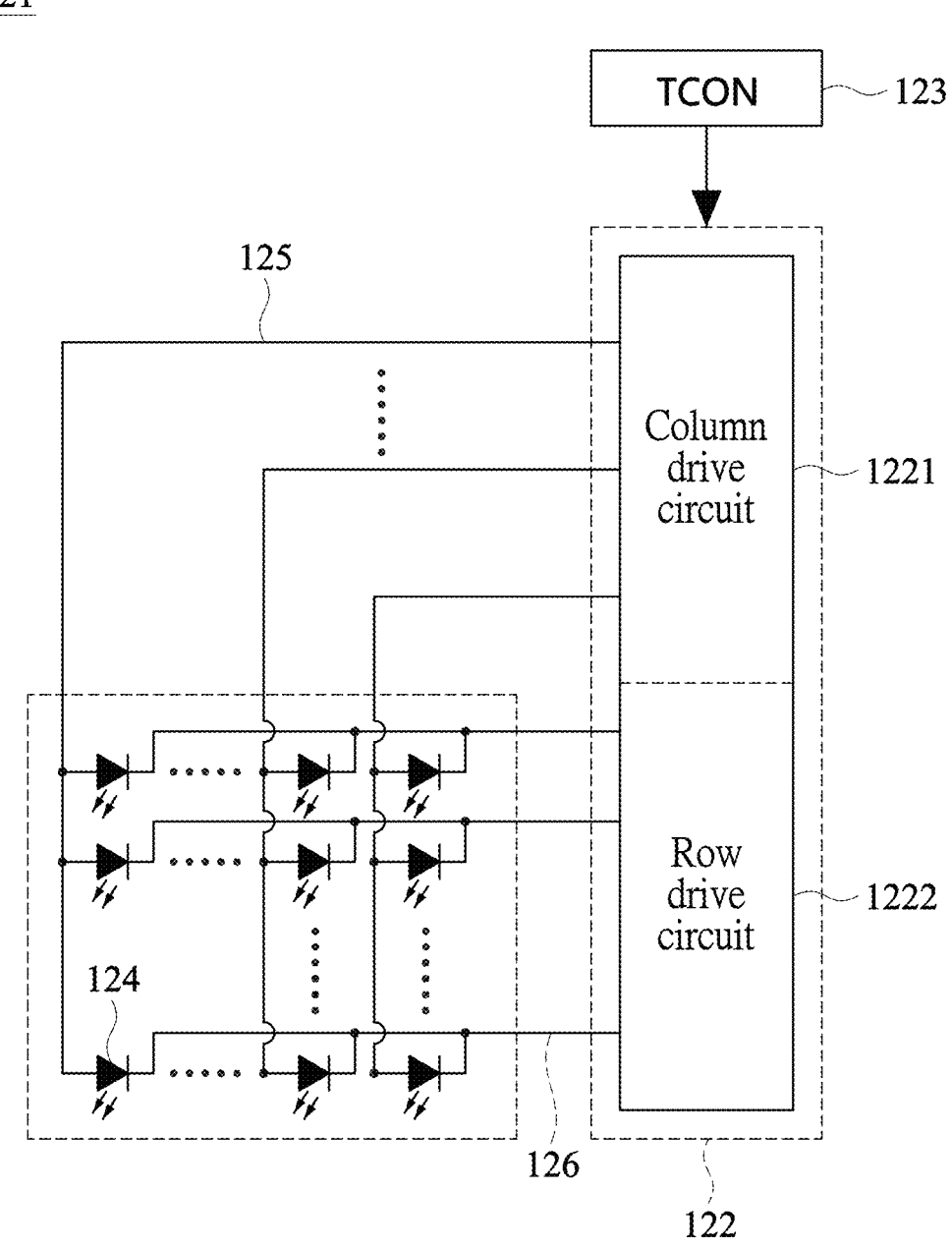
FIG. 2 shows a circuit diagram illustrating the block of the display panel of FIG. 1A/1B.

FIG. 2 shows a circuit diagram illustrating the block 121 of the display panel 12 of FIG. 1A/1B. In the embodiment, the display panel 12 may adopt passive (matrix) driving method for driving the microLEDs 124. Specifically, the driver 122 may include a column drive circuit 1221 and a row (or scan) drive circuit 1222, which may, for example, be made in a single integrated circuit. The column drive circuit 1221 transmits column drive signals to first electrodes (e.g., anodes) of the microLEDs 124 on the same columns via column conductive wires 125, and the row drive circuit 1222 transmits row drive signals to second electrodes (e.g., cathodes) of the microLEDs 124 on the same rows via row conductive wires 126.

Returning back to FIG. 1A/1B, in one embodiment, the display panels 12 are separated from each other, for example, by (glass) cutting (along the dotted line as denoted in FIG. 1A) after attaching to the supporting film 11. In an alternative embodiment, the display panels 12 are separated from each other, for example, by (glass) cutting or are individually made before attaching to the supporting film 11. As exemplified in FIG. 1A and FIG. 1B, a total width/length of the display panels 12 is less than a corresponding width/length of the supporting film 11. According to the embodiment as described in FIG. 1A/1B, the display panels 12 may be folded as shown in FIG. 1C, which shows a side view illustrating the foldable microLED display 100 of FIG. 1A being folded. In an alternative embodiment, the display panels 12 may be folded as shown in FIG. 1D, which shows a side view illustrating the foldable microLED display 100 of FIG. 1A being folded. It is noted that, after unfolding the display panels 12 from a folded state on the site to result in an unfolded state as shown in FIG. 1B, a gap between neighbor display panels 12 may be filled with a material having a refractive index being substantially the same as the display panels 12 (e.g., glass). Accordingly, no trace or mark may be perceived by a viewer, thereby improving display quality of the foldable microLED display 100. Alternatively, the gap between neighbor display panels 12 may be filled with black matrix (BM), for example, composed of photoresist, having a refractive index being substantially different from the display panels 12.

Figures 3A, 3B, 3C, 3D:
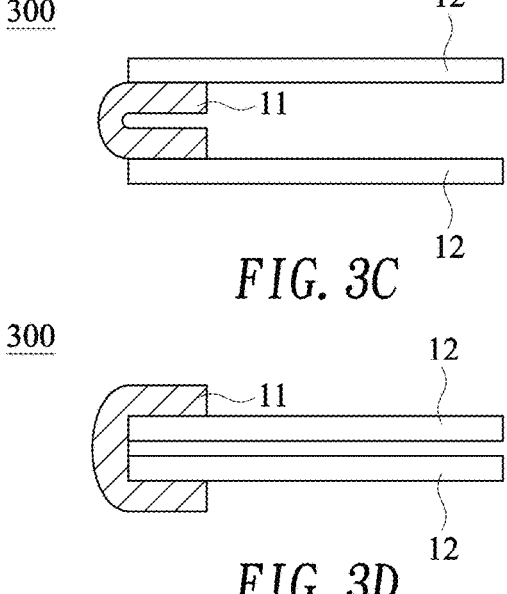
FIG. 3A shows a top view illustrating a foldable microLED display according to another embodiment of the present invention.
FIG. 3B shows a side view illustrating the foldable microLED display of FIG. 3A.
FIG. 3C shows a side view illustrating the foldable microLED display of FIG. 3A being folded.
FIG. 3D shows a side view illustrating the foldable microLED display of FIG. 3A being folded.

FIG. 3A shows a top view illustrating a foldable microLED display 300 according to another embodiment of the present invention, and FIG. 3B shows a side view illustrating the foldable microLED display 300 of FIG. 3A. The foldable microLED display 300 (of FIG. 3A/3B) is similar to the foldable microLED display 100 (of FIG. 1A/1B) with the following exceptions. As exemplified in FIG. 3A and FIG. 3B, a total width/length of the display panels 12 is greater than a corresponding width/length of the supporting film 11. According to the embodiment as described in FIG. 3A/3B, the display panels 12 may be folded as shown in FIG. 3C, which shows a side view illustrating the foldable microLED display 300 of FIG. 3A being folded. In an alternative embodiment, the display panels 12 may be folded as shown in FIG. 3D, which shows a side view illustrating the foldable microLED display 300 of FIG. 3A being folded.

Figures 4A, 4B, 4C, 4D:
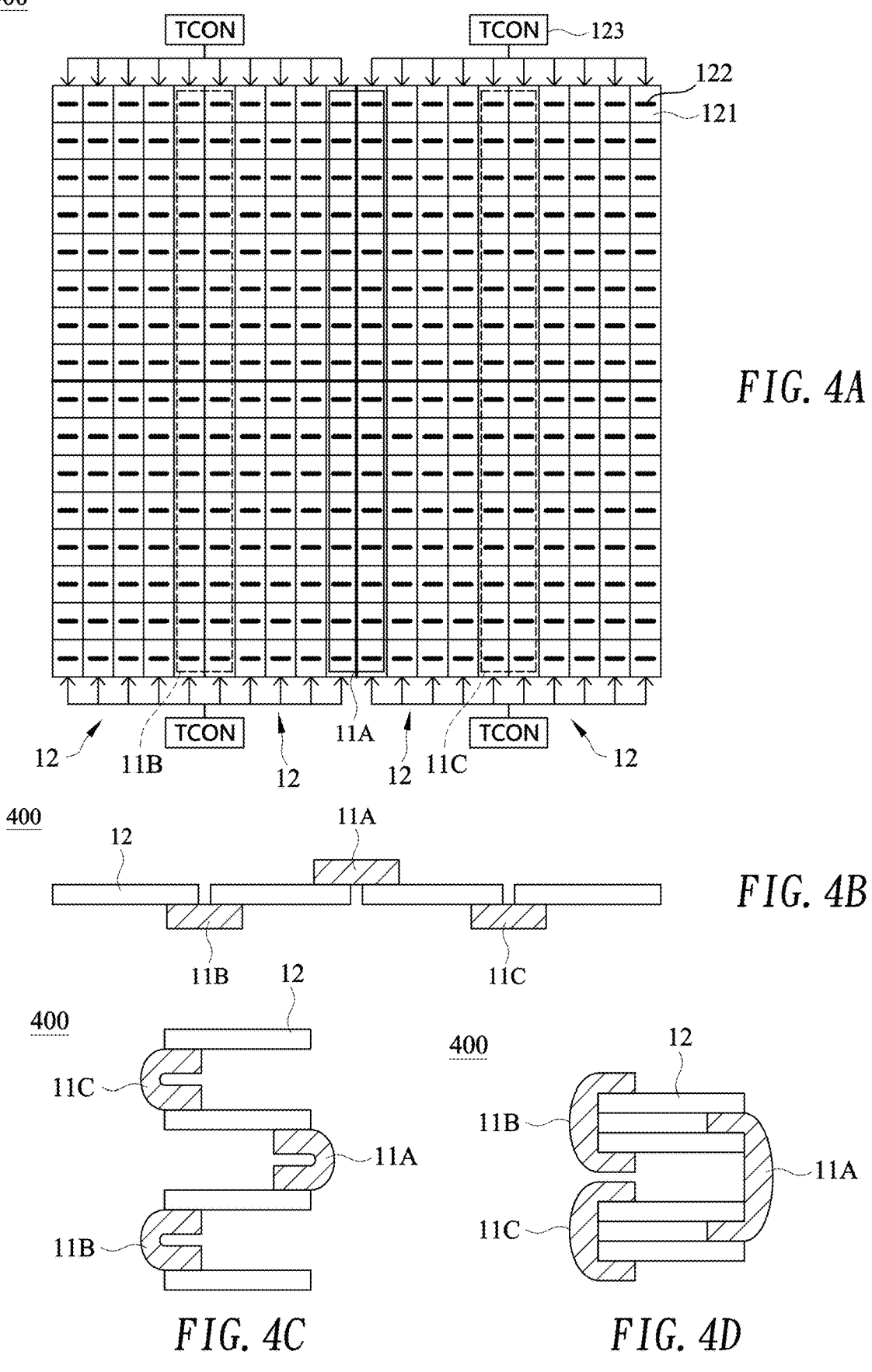
FIG. 4A shows a top view illustrating a foldable microLED display according to a further embodiment of the present invention.
FIG. 4B shows a side view illustrating the foldable microLED display of FIG. 4A.
FIG. 4C shows a side view illustrating the foldable microLED display of FIG. 4A being folded.
FIG. 4D shows a side view illustrating the foldable microLED display of FIG. 4A being folded.

FIG. 4A shows a top view illustrating a foldable microLED display 400 according to a further embodiment of the present invention, and FIG. 4B shows a side view illustrating the foldable microLED display 400 of FIG. 4A. Specifically, as exemplified in the figures, a supporting film 11A (denoted as solid block) is disposed on a top surface of the foldable microLED display 400, and a supporting film 11B (denoted as dotted block) and a supporting film 11C (denoted as dotted block) are disposed on a bottom surface of the foldable microLED display 400. According to the embodiment as described in FIG. 4A/4B, the display panels 12 may be folded as shown in FIG. 4C, which shows a side view illustrating the foldable microLED display 400 of FIG. 4A being folded. In an alternative embodiment, the display panels 12 may be folded as shown in FIG. 4D, which shows a side view illustrating the foldable microLED display 400 of FIG. 4A being folded.

FIG. 4E shows a top view illustrating a foldable microLED display 400 according to an alternative embodiment of the present invention, and FIG. 4F-FIG. 4G show side views illustrating the foldable microLED display 400 of FIG. 4E. Specifically, as exemplified in FIG. 4F, the supporting films 11A-11C may be disposed on a bottom surface of the foldable microLED display 400, which may be a top-emission microLED display. As exemplified in FIG. 4G, the supporting films 11A-11C may be disposed on a top surface of the foldable microLED display 400, which may be a bottom-emission microLED display.

Figure 5:
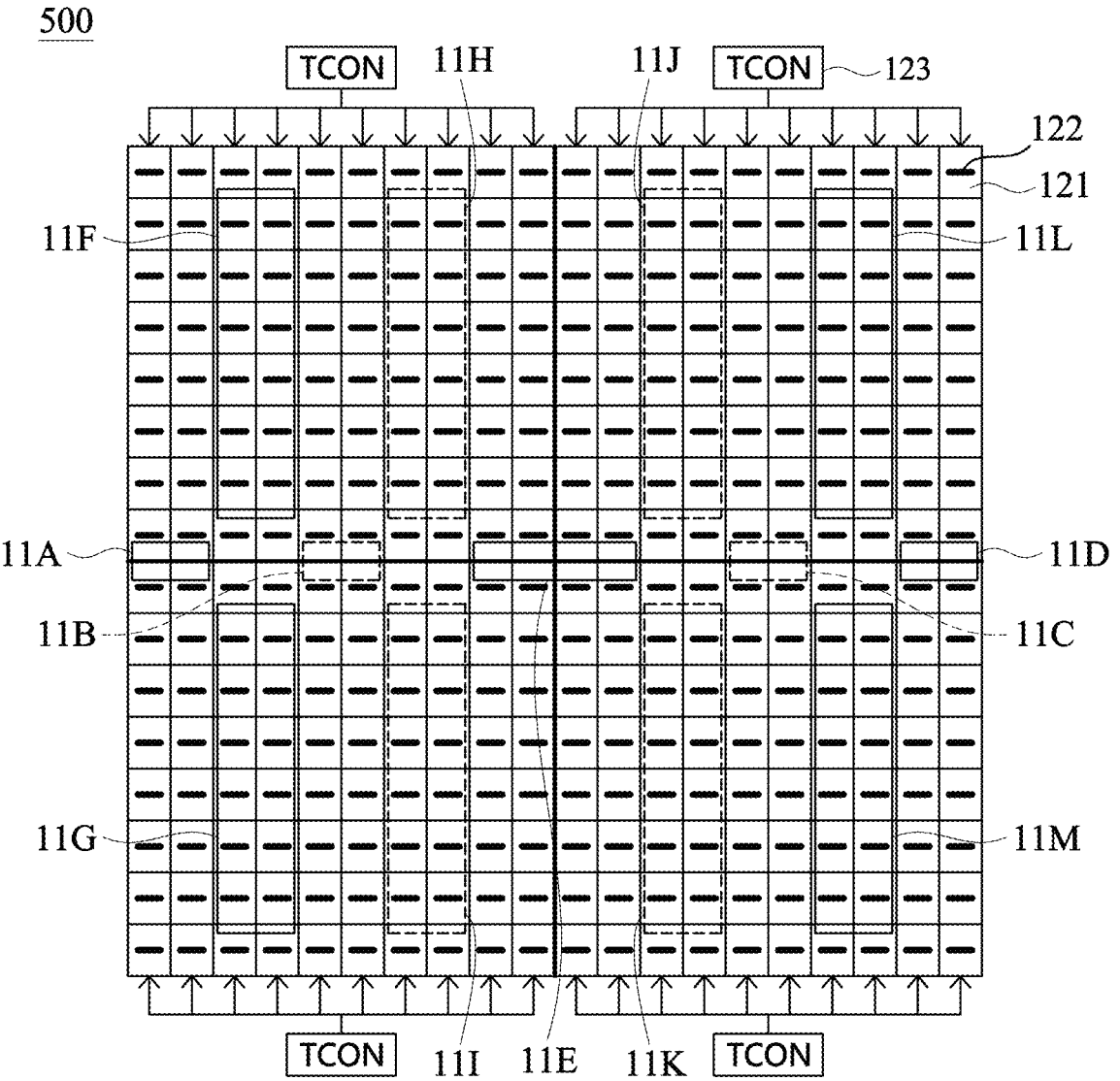
FIG. 5 shows a top view illustrating a foldable microLED display according to a further embodiment of the present invention.
Figure 6:
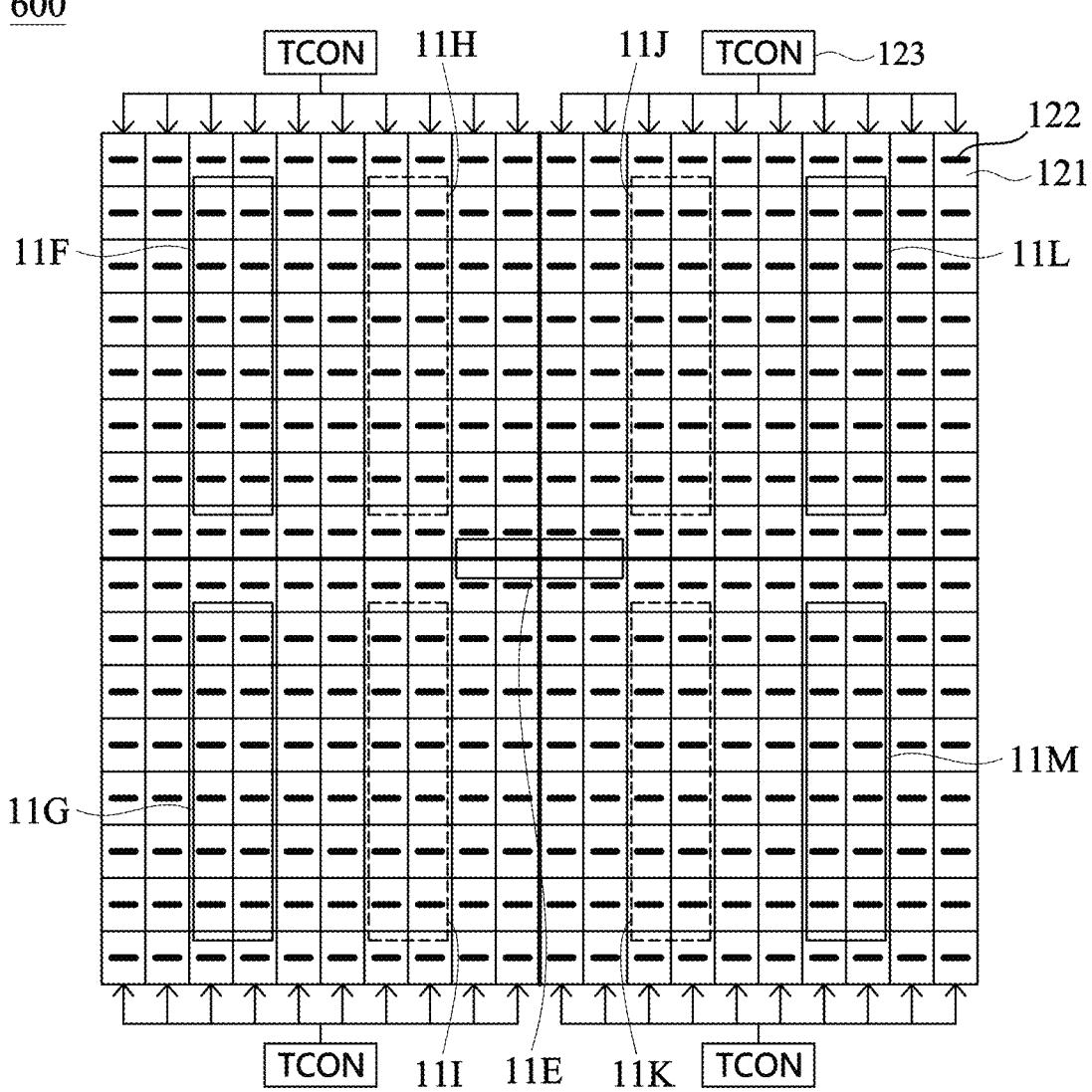
FIG. 6 shows a top view illustrating a foldable microLED display according to a further embodiment of the present invention.

It is appreciated that the supporting films 11 may be disposed on the microLED display freely according to requirements of specific applications. FIG. 5 shows a top view illustrating a foldable microLED display 500 according to a further embodiment of the present invention. As exemplified in the figure, supporting films 11A, 11D, 11E, 11F, 11G, 11L, 11M (denoted as solid blocks) are disposed on a top surface of the foldable microLED display 500, and supporting films 11B, 11C, 11H, 11I, 11J, 11K (denoted as dotted blocks) are disposed on a bottom surface of the foldable microLED display 500. According to one aspect of the embodiment, some supporting films 11 (e.g., 11A) are disposed along a lateral or horizontal direction, and other supporting films 11 (e.g., 11F) are disposed along a longitudinal or vertical direction. Therefore, the foldable microLED display 500 may be folded both in the direction of width (i.e., widthwise) and in the direction of length (i.e., lengthwise). In an alternative embodiment as depicted in FIG. 6, which shows a top view illustrating a foldable microLED display 600 according to a further embodiment of the present invention. The foldable microLED display 600 (FIG. 6) is similar to the foldable microLED display 500 except that the supporting films 11A, 11B, 11C, 11D are omitted.

Figure 7:
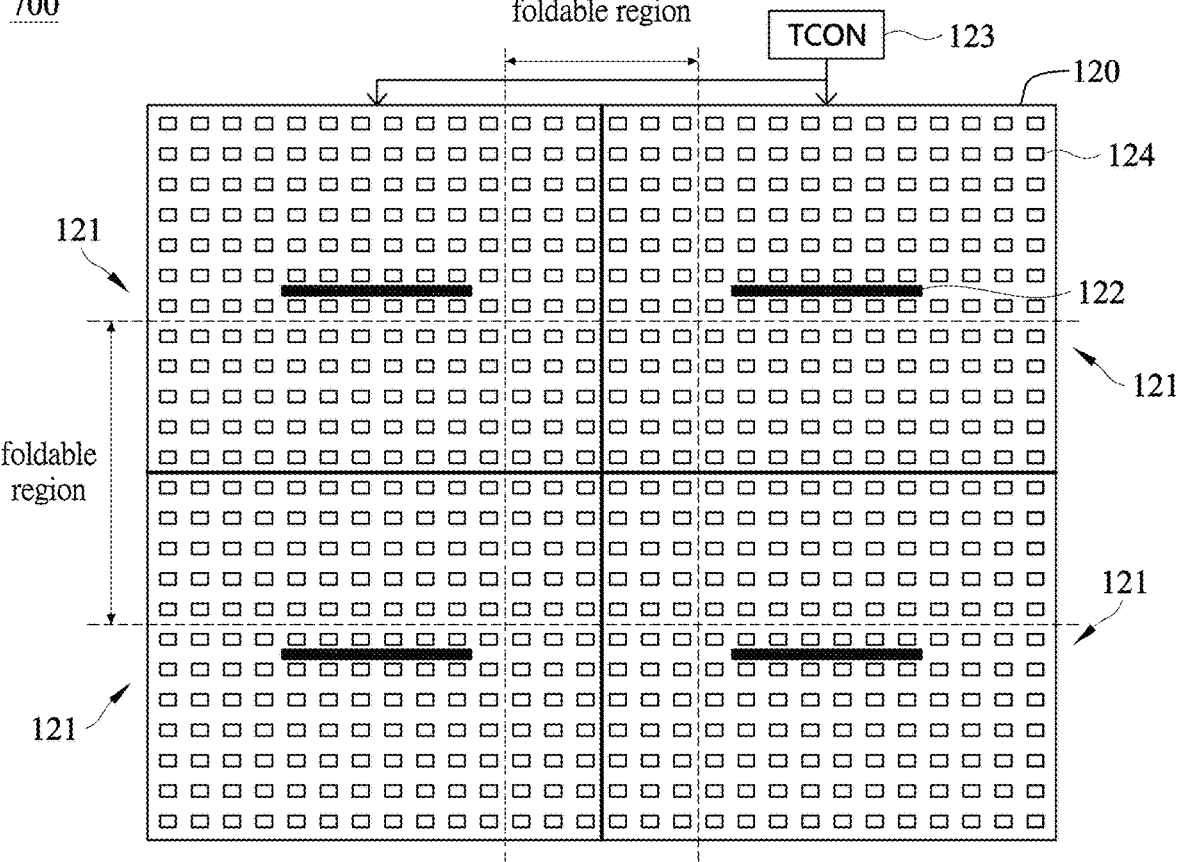
FIG. 7 shows a partial top view illustrating a foldable microLED display according to one embodiment of the present invention.

FIG. 7 shows a partial top view illustrating a foldable microLED display 700 according to one embodiment of the present invention.

In the embodiment, the foldable microLED display 700 may include a single (undivided) flexible substrate 120 (e.g., flexible printed circuit board). The foldable microLED display 700 may include a plurality of blocks 121 each having a plurality of microLEDs 124 controlled by a corresponding driver 122. The foldable microLED display 700 may include at least one timing controller (TCON) 123 configured to control the drivers 122. As exemplified in FIG. 7, a foldable region is defined to be located between neighbor drivers 122 (and between neighbor microLEDs 124) such that no drivers 122 or microLEDs 124 will be damaged when folding the microLED display 700 along the foldable region. Moreover, in the embodiment, it is noted that conductive wiring disposed on the flexible substrate 120 adopts a malleable material capable of deforming plastically without failure under compressive stress while folding the microLED display 700.

Although specific embodiments have been illustrated and described, it will be appreciated by those skilled in the art that various modifications may be made without departing from the scope of the present invention, which is intended to be limited solely by the appended claims.

What is claimed is:

1. A foldable micro-light-emitting diode (microLED) display, comprising:
   a flexible supporting film;
   a plurality of drivers; and
   a plurality of display panels attached to the flexible supporting film, each display panel including a plurality of blocks each having a plurality of microLEDs controlled by a corresponding driver;
   wherein at least one first flexible supporting film is disposed along a lateral direction such that display panels connected to both sides of the first flexible supporting film are foldable along the lateral direction, and at least one second flexible supporting film is disposed along a longitudinal direction such that display panels connected to both sides of the second flexible supporting film are foldable along the longitudinal direction;
   wherein a length of the at least one first flexible supporting film and a length of the at least one second flexible supporting film are less than a corresponding length of each attached display panel.

2. The foldable microLED display of claim 1, wherein the flexible supporting film comprises a flexible material.

3. The foldable microLED display of claim 2, wherein the flexible material comprises polyimide (PI), Polyethylene terephthalate (PET) or polycarbonate (PC).

4. The foldable microLED display of claim 1, wherein the plurality of display panels are attached to the flexible supporting film by glue.

5. The foldable microLED display of claim 1, wherein each display panel comprises a rigid substrate.

6. The foldable microLED display of claim 5, wherein the rigid substrate comprises glass.

7. The foldable microLED display of claim 1, wherein each display panel further comprises at least one timing controller configured to control corresponding drivers.

8. The foldable microLED display of claim 1, wherein each display panel adopts passive driving method for driving the plurality of microLEDs.

9. The foldable microLED display of claim 1, wherein the plurality of display panels are separated from each other after attaching to the flexible supporting film.

10. The foldable microLED display of claim 1, wherein the plurality of display panels are separated from each other before attaching to the flexible supporting film.

11. The foldable microLED display of claim 1, further comprising a material to be filled in a gap between neighbor display panels that are unfolded from a folded state.

12. The foldable microLED display of claim 11, wherein the material filled in the gap has a refractive index being substantially the same as the display panels.

13. The foldable microLED display of claim 11, wherein the gap is filled with black matrix (BM).

14. The foldable microLED display of claim 1, wherein a total width or length of the plurality of display panels is greater than a corresponding width or length of the flexible supporting film, and at least one flexible supporting film is disposed on a top surface of the display panels, or at least one flexible supporting film is disposed on a bottom surface of the display panels.

15. The foldable microLED display of claim 14, wherein all flexible supporting films are disposed on a bottom surface or a top surface of the display panels.

* * * * *